(12) United States Patent
Yamashita

(10) Patent No.: US 10,096,790 B2
(45) Date of Patent: Oct. 9, 2018

(54) DISPLAY DEVICE

(71) Applicant: Funai Electric Co., Ltd., Daito, Osaka (JP)

(72) Inventor: Hiroshi Yamashita, Kanagawa (JP)

(73) Assignee: FUNAI ELECTRIC CO., LTD., Osaka (JP)

( * ) Notice: Subject to any disclaimer, the term of this patent is extended or adjusted under 35 U.S.C. 154(b) by 0 days.

(21) Appl. No.: 15/653,431

(22) Filed: Jul. 18, 2017

(65) Prior Publication Data
US 2018/0033991 A1 Feb. 1, 2018

(30) Foreign Application Priority Data
Jul. 26, 2016 (JP) .................................. 2016-146235

(51) Int. Cl.
| H01L 51/50 | (2006.01) |
| G02F 1/00 | (2006.01) |
| G02F 1/1335 | (2006.01) |
| H01L 51/52 | (2006.01) |

(52) U.S. Cl.
CPC ........ *H01L 51/5012* (2013.01); *G02F 1/0063* (2013.01); *G02F 1/133605* (2013.01); *H01L 51/5044* (2013.01); *H01L 51/5265* (2013.01)

(58) Field of Classification Search
None
See application file for complete search history.

(56) References Cited

U.S. PATENT DOCUMENTS

| 7,370,979 B2* | 5/2008 | Whitehead | H01J 63/06 345/207 |
| 2007/0159849 A1* | 7/2007 | Sakai | G02F 1/133603 362/612 |
| 2008/0074060 A1* | 3/2008 | Ye | |
| 2011/0063850 A1* | 3/2011 | Oide | G02F 1/133603 362/296.01 |

FOREIGN PATENT DOCUMENTS

| JP | 2005-520188 A | 7/2005 |
| WO | 2012-029598 A1 | 3/2012 |

OTHER PUBLICATIONS

Extended European Search Report of the corresponding European Application No. 17182492.3, dated Dec. 22, 2017.

* cited by examiner

*Primary Examiner* — Martin Mushambo
(74) *Attorney, Agent, or Firm* — Global IP Counselors, LLP

(57) ABSTRACT

A display device includes a display, a plurality of first reflectors, a light processing member, and a plurality of light sources. The first reflectors each have a first bottom part that is disposed on a rear face side of the display and a first peripheral part that extends from an outer edge of the first bottom part toward a rear face of the display, with a surface of the first bottom part and a surface of the first peripheral part forming an obtuse angle. The light processing member is disposed between the display and the first reflectors, the light processing member being spaced apart from the first reflectors by a specific distance. The light sources are disposed relative to the surfaces of the first bottom parts, respectively.

20 Claims, 8 Drawing Sheets

FIRST EMBODIMENT

SECOND EMBODIMENT

FIRST MODIFICATION EXAMPLE

DISPLAY DEVICE

CROSS-REFERENCE TO RELATED APPLICATIONS

This application claims priority to Japanese Patent Application No. 2016-146235 filed on Jul. 26, 2016. The entire disclosure of Japanese Patent Application No. 2016-146235 is hereby incorporated herein by reference.

BACKGROUND

Field of the Invention

The present invention generally relates to a display device. More specifically, the present invention relates to a display device having a reflecting member that reflects light from a light source towards a display.

Background Information

Display devices having a reflecting member that reflects light from a light source towards a display are well known in the art.

Japanese Translation of PCT International Application Publication No. 2005-520188 (Patent Literature 1) discloses a display device having a light modulator, a plurality of reflective-walled channels, a plurality of LEDs, and a diffuser. The reflective-walled channels are disposed on a rear face side of the light modulator and extend toward the rear face of the light modulator. The LEDs are disposed inside of the reflective-walled channels. The light modulator and the reflective-walled channels are disposed apart from each other.

SUMMARY

With the above-mentioned Patent Literature 1, the reflective-walled channels and the rear face of the light modulator are perpendicular. Thus, part of the light from the LEDs that has a relatively large angle with respect to a direction perpendicular to the rear face of the light modulator maintains its angle with respect to the rear face while being reflected inside the reflective-walled channels and moving closer to the light modulator. This results in that the light from an LED leaks from a gap between the light modulator and a corresponding reflective-walled channel into areas corresponding to other LEDs. As a result, the contrast of the display device tends to be less sharp between the areas corresponding to the LEDs on the light modulator.

One object of the present disclosure is to provide a display device with which sharper contrast between the areas corresponding to light sources on a display can be achieved.

In view of the state of the know technology and in accordance with a first aspect, a display device includes a display, a plurality of first reflectors, a light processing member, and a plurality of light sources. The first reflectors each have a first bottom part that is disposed on a rear face side of the display and a first peripheral part that extends from an outer edge of the first bottom part toward a rear face of the display. A surface of the first bottom part and a surface of the first peripheral part form an obtuse angle. The light processing member is disposed between the display and the first reflectors. The light processing member is spaced apart from the first reflectors by a specific distance. The light sources are disposed relative to the surfaces of the first bottom parts, respectively.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

First Embodiment

The configuration of a display device 100 in accordance with a first embodiment will be described through reference to FIGS. 1 to 8.

Figure 1:
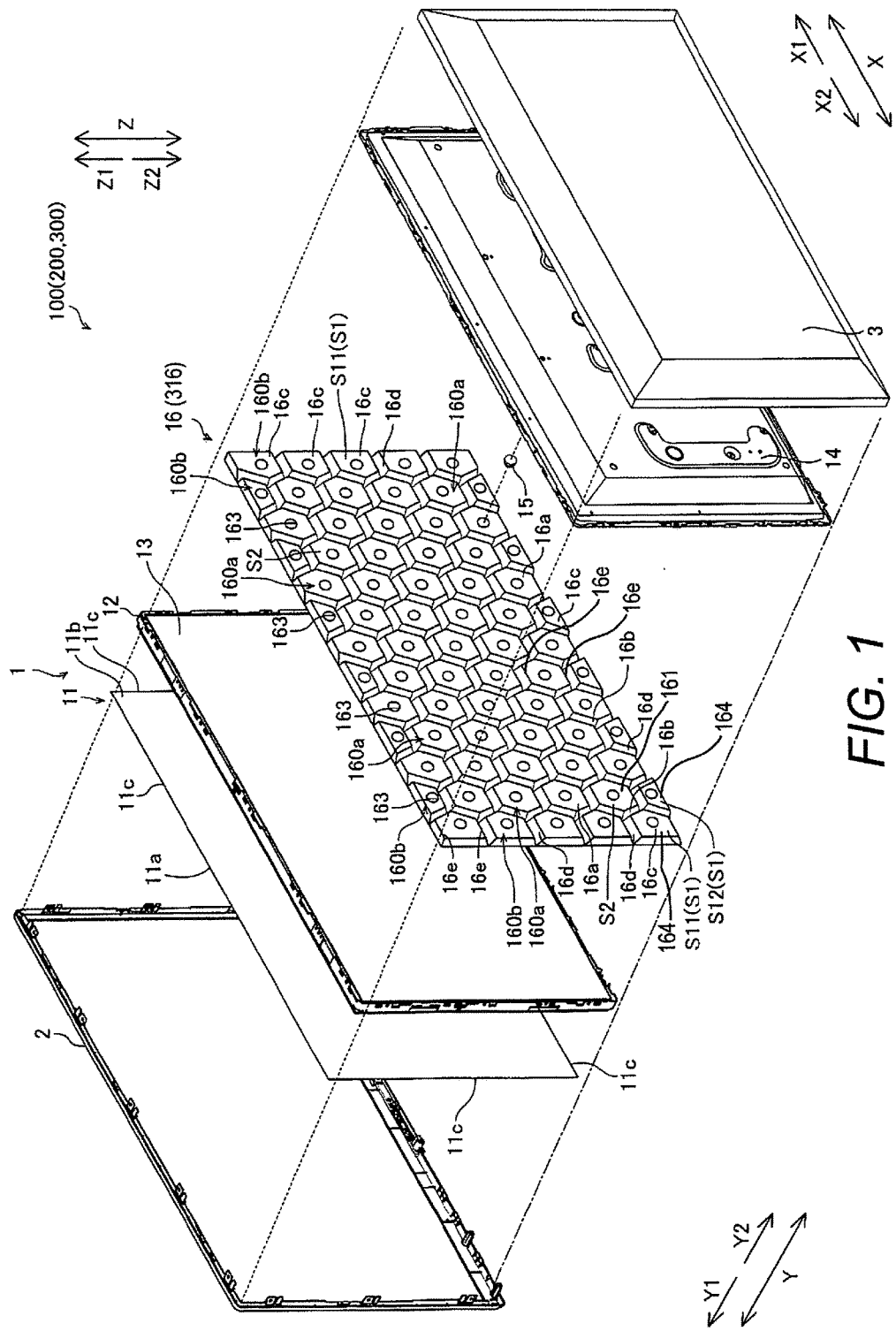
FIG. 1 is an exploded rear perspective view of a display device in accordance with first to third embodiments.

As shown in FIG. 1, the display device 100 includes a display module 1, a front cabinet 2 and rear cabinet 3. The front cabinet 2 and the rear cabinet 3 house the display module 1.

The display module 1 includes at least a liquid crystal cell 11 (e.g., a display panel or a display), at least one optical sheet 13 (e.g., a light processing member), a plurality of light sources 15, and a reflective sheet 16. In the illustrated embodiment, the display module 1 also includes a light intensity adjuster 17 (see FIG. 2). In the illustrated embodiment, the display module 1 also includes a molding frame 12 that holds the liquid crystal cell 11, and a rear frame 14. The liquid crystal cell 11 is an example of the "display" in the present disclosure. Also, the optical sheet 13 is an example of the "light processing member" in the present disclosure.

The front cabinet 2 is provided so as to cover the display module 1. The front cabinet 2 is fixed to the rear frame 14. The liquid crystal cell 11 has a display face 11*a* (e.g., a front face) and a rear face 11*b* that is opposite the display face 11*a*.

The rear face 11b is located to the rear of the display face 11a (in the Y2 direction). In the following description, an X direction indicates a lateral direction of the display device 100 (X1 direction: leftward, X2 direction rightward), a Y direction indicates a frontward and rearward direction of the display device 100 (Y1 direction: frontward, Y2 direction: rearward), and a Z direction indicates an up and down direction of the display device 100 (Z1 direction: upward, Z2 direction: downward). The lateral direction (X direction) is perpendicular to the frontward and rearward direction (Y direction) and the up and down direction (Z direction). Also, in the illustrated embodiment, both the lateral direction (X direction) and the up and down direction (Z direction) indicate a direction "to the side." That is, a direction that is perpendicular to the frontward and rearward direction (Y direction) refers to a direction to the side.

The liquid crystal cell 11 has a rectangular shape. The lengthwise direction of the liquid crystal cell 11 matches with the lateral direction (X direction). The molding frame 12 is a plastic frame-shaped member, and holds the liquid crystal cell 11 on the front side (the Y1 direction side). The molding frame 12 also holds the optical sheet 13 on the rear side (the Y2 direction side). The molding frame 12 is disposed inside of the front cabinet 2. The optical sheet 13 is disposed between the liquid crystal cell 11 and the light sources 15. The optical sheet 13 is formed by a single optical sheet including a diffusion sheet (diffuser) or such functional sheet. The optical sheet 13 can also be formed by a plurality of optical sheets, including a diffusion sheet or other such functional sheets. In this case, the optical sheets can be various kinds of optical sheets.

The rear frame 14 is made of sheet metal, and is formed so as to cover the rear side of the display module 1. The front cabinet 2, the rear cabinet 3 (see FIG. 1), various kinds of circuit board (not shown), and so forth are attached and fixed to the rear frame 14.

The light sources 15 are disposed on the rear side (the Y2 direction side) of the liquid crystal cell 11. In FIG. 1, for the sake of description, just one representative light source 15 is depicted. However, in the illustrated embodiment, the light sources 15 are provided at locations corresponding to openings 163 (discussed below) of the reflective sheet 16. In the illustrated embodiment, seventy-one light sources 15 are arranged over the reflective sheet 16. Of course, the display device 100 can include different number of light sources as needed and/or desired. Also, the light sources 15 can be formed by different types of light sources. The light sources 15 are configured to emit light at the liquid crystal cell 11 from the rear side of the liquid crystal cell 11. That is, the display device 100 is a direct-backlit type of liquid crystal display device. The light sources 15 are disposed in an array to the side. Also, the light sources 15 are disposed on the faces of first bottom parts 16a (discussed below).

More precisely, the light sources 15 are arranged in columns running in the up and down direction (Z direction). In the illustrated embodiment, thirteen columns (light source columns) are arranged with respect to each other in the lateral direction (X direction). These columns each include a plurality of light sources 15 that is aligned in the up and down direction. Specifically, in the illustrated embodiment, odd-numbered columns counting from the X1 direction side each include five light sources 15, while even-numbered columns counting from the X1 direction side each include six light sources 15. In the illustrated embodiment, the light sources 15 forming the odd-numbered columns are disposed at the same height positions in the up and down direction (Z direction). In other words, these light sources 15 are also arranged in rows in each of which a plurality of (seven in FIG. 1) light sources 15 are aligned with respect to each other as viewed in the X direction. Also, the light sources 15 forming the even-numbered columns are disposed at the same height positions in the up and down direction (Z direction) in between the light sources 15 forming the odd-numbered columns. In other words, these light sources 15 are also arranged in rows in each of which a plurality of (six in FIG. 1) light sources 15 are aligned with respect to each other as viewed in the X direction. In the illustrated embodiment, the light sources 15 forming the odd-numbered columns, and the light sources 15 forming the even-numbered columns are arranged at equidistant spacing in the lateral direction (X direction). An exception to this is that light sources 15 disposed near the outer edges 11c of the liquid crystal cell 11 (e.g., light sources 15 surrounded by second peripheral parts 16d as discussed below) are disposed slightly to the inside of the liquid crystal cell 11 so as not to overlap the outer edges 11c as seen from the front (as seen in the Y1 direction).

Figure 3:
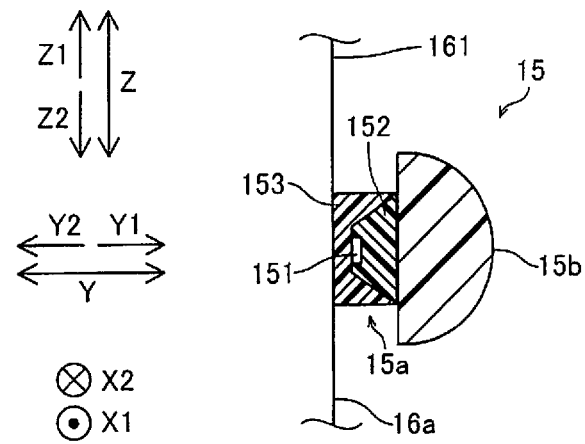
FIG. 3 is a cross sectional view of a light source of the display device in accordance with the first embodiment.

As shown in FIG. 3, the light sources 15 each include a light emitting element package 15a, a lens component 15b, and a board (not shown) on which the light emitting element packages 15a are mounted.

The light emitting element packages 15a each include a light emitting element 151 that emit light, a sealing component 152, and reflector 153. In the illustrated embodiment, the light emitting elements 151 include LEDs (light emitting diodes). However, the light emitting elements 151 can include organic electroluminescence elements, or other such luminous elements. The sealing components 152 seal the light emitting elements 151. The sealing components 152 contain a phosphor. The reflectors 153 are disposed to the rear (Y2 direction) of the light emitting elements 151 and the sealing components 152. Also, the reflectors 153 have a concave shape that is recessed to the rear so as to cover the light emitting elements 151 from the side and from the rear. Also, the reflectors 153 are configured to reflect light from the light emitting elements 151 towards the lens components 15b.

The lens components 15b are disposed in front of the light emitting element packages 15a in a state of contact with the front faces of the light emitting element packages 15a. Also, the lens components 15b are formed in a circular shape and are configured to diffuse light from the light emitting elements 151 substantially evenly in the peripheral direction. That is, the lens components 15b have a shape in which a hemispherical shape that protrudes frontward is flattened in the frontward and rearward direction (a bowl shape).

Figure 2:
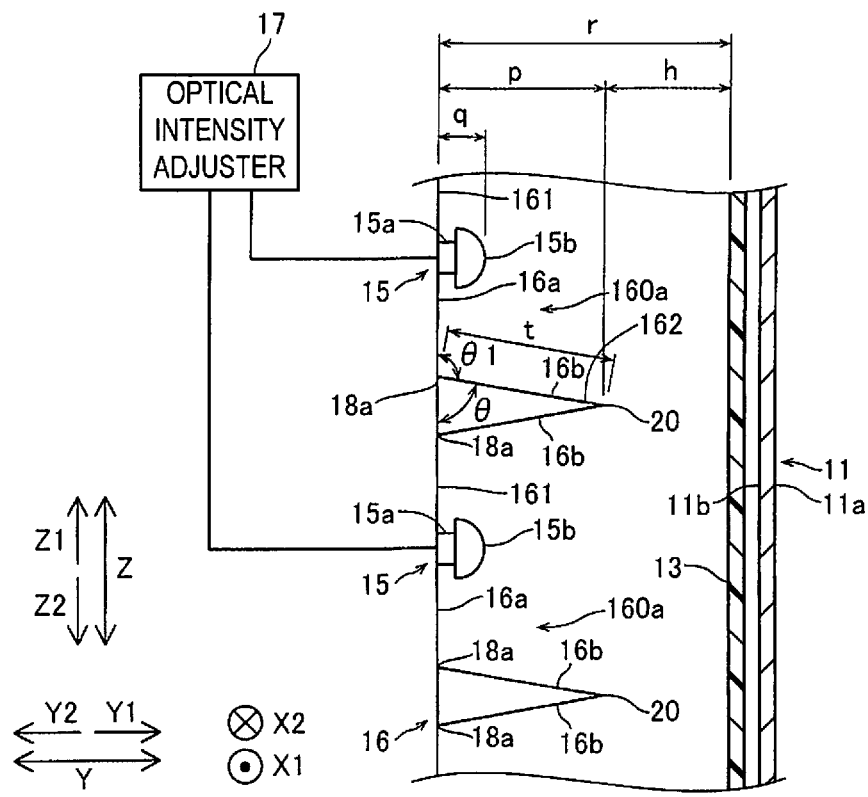
FIG. 2 is a schematic diagram illustrating an electrical configuration and a partial cross sectional side view of a reflective sheet and light sources of the display device in accordance with the first embodiment.
Figure 4:
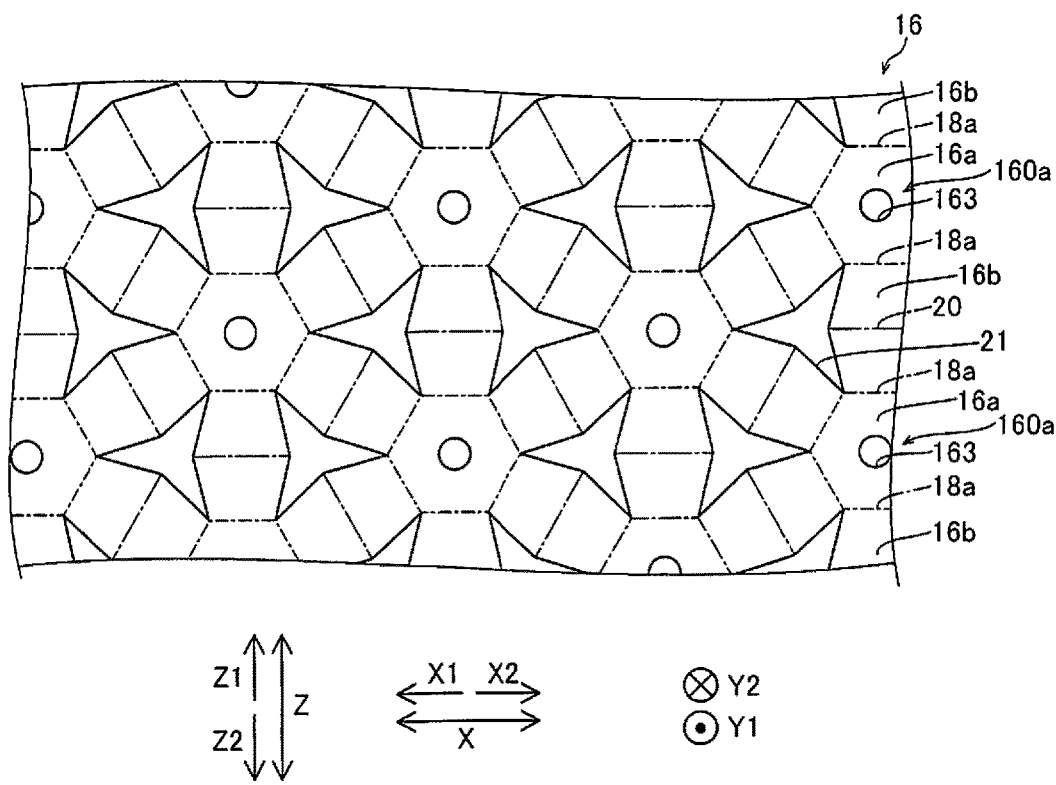
FIG. 4 is a development view of a reflective sheet of the display device in accordance with the first embodiment, illustrating an unfolded state of the reflective sheet in the display device.

The reflective sheet 16 includes a plurality of (forty-nine in FIG. 1) first reflectors 160a and a plurality of (twenty-two) second reflectors 160b. As shown in FIG. 1, the reflective sheet 16 has an overall rectangular shape corresponding to the shape of the liquid crystal cell 11 or the optical sheet 13 while the reflective sheet 16 is in a folded state. As shown in FIG. 1, the first reflectors 160a each include a first bottom part 16a and a plurality of first peripheral parts 16b. The second reflectors 160b each include a second bottom part 16c and a plurality of second peripheral parts 16d. The reflective sheet 16 is configured so that light from the light sources 15 is reflected to the liquid crystal cell 11 side by the first bottom parts 16a, the first peripheral parts 16b, the second bottom parts 16c, and the second peripheral parts 16d. As shown in FIG. 4, the first bottom parts 16a, the first peripheral parts 16b, the second bottom parts 16c, and the second peripheral parts 16d are formed integrally into a single reflective sheet 16 (sheet-like member). In other words, the reflective sheet 16 is integrally formed as a one-piece, unitary member, and is made of a resin sheet, a metal sheet, or other such material suitable for a reflective sheet. Also, as shown in FIG. 1, the first bottom parts 16a and the first peripheral parts 16b are provided in an array along the rear face 11b of the liquid crystal cell 11 in the same layout as the light sources 15. The first reflectors 160a and the optical sheet 13 are separated by a specific spacing (e.g., specific distance) h (see FIG. 2). Also, the first reflectors 160a are disposed at a substantially equidistant interval in the direction extending to the rear face 11b of the liquid crystal cell 11 (the X direction and the Z direction). The distances h (=r−p) (see FIG. 2) from the ends 20 of the first peripheral parts 16b on the optical sheet 13 side to the optical sheet 13 are substantially equal to each other. More specifically, in the illustrated embodiment, as shown in FIG. 2, the frontmost portions of the first reflectors 160a (i.e., the front distal ends 20 of the first peripheral parts 16b) are spaced away from the rear face of the optical sheet 13 by the specific distances h, respectively.

The first bottom parts 16a and the second bottom parts 16c are disposed on the rear face 11b side of the liquid crystal cell 11. The first bottom parts 16a each have a hexagonal shape extending to the side along the rear face 11b of the liquid crystal cell 11. Therefore, the first bottom parts 16a are disposed parallel to the display face 11a (the rear face 11b) of the liquid crystal cell 11. One light source 15 is disposed in the center inside each of the first bottom parts 16a. The second bottom parts 16c are disposed inside the second peripheral parts 16d. The second bottom parts 16c each have a pentagonal or tetragonal shape. Also, openings 163 (see FIG. 4) are provided to the first bottom parts 16a and the second bottom parts 16c to allow the light sources 15 to be passed through the center. The second peripheral parts 16d will be described in detail below. The light sources 15 are fixed to the rear frame 14. The light sources 15 extends through the openings 163 in the first bottom parts 16a and the second bottom parts 16c. The light sources 15 are disposed so as to extend from the rear of the first bottom parts 16a and the second bottom parts 16c and to be exposed to the front of the first bottom parts 16a and the second bottom parts 16c. In other words, the light sources 15 extend from the rear frame 14 through the openings 163 in the reflective sheet 16, and face with the rear face 11b via the optical sheet 13. In the illustrated embodiment, the first reflectors 160a are identical to each other. Also, the second reflectors 160b with the pentagonal second bottom parts 16c are identical to each other. Also, the second reflectors 160b with the tetragonal second bottom parts 16c are identical to each other.

Figure 5:
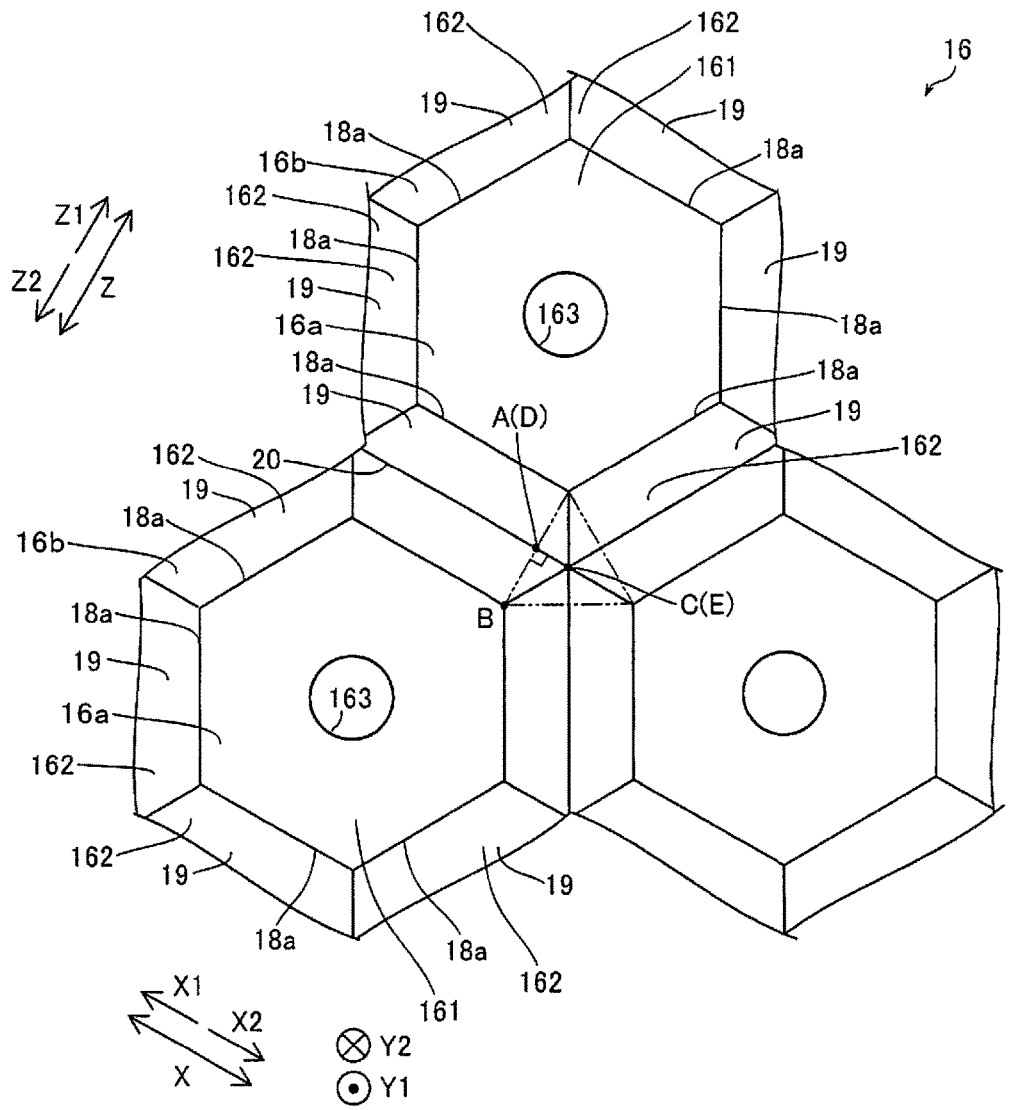
FIG. 5 is a partial front elevational view of the reflective sheet in accordance with the first embodiment, illustrating first bottom parts and first peripheral parts of reflectors of the reflective sheet in a state in which the reflective sheet has been folded.

As shown in FIG. 5, the first peripheral parts 16b are disposed so as to surround the periphery of each of the light sources 15 (see FIG. 2) as viewed from front. The first peripheral parts 16b are formed in a part of a hexagonal pyramid extending frontward from the outer periphery of each of the first bottom parts 16a. Also, the first peripheral parts 16b extend from the outer edges of each of the first bottom parts 16a toward the rear face 11b. In the illustrated embodiment, the first bottom parts 16a has a regular hexagonal shape with six outer edges. Thus, six first peripheral parts 16b are provided around each of the first bottom parts 16a. The first bottom parts 16a contact with the sides of adjacent first peripheral parts 16b. The first peripheral parts 16b are disposed so that a pair of opposing sides 16e of the hexagonal shape (see FIG. 1) extends in the lateral direction (X direction) of the liquid crystal cell 11 (see FIG. 1). Also, the first peripheral parts 16b are inclined to the first bottom parts 16a. In particular, as shown in FIG. 2, the surface 161 of each of the first bottom parts 16a and the surface 162 of each of the first peripheral parts 16b form an obtuse angle θ1. The angle θ1 is a complementary angle of the angle θ at ∠ABD shown in FIG. 7. The angle θ1 is preferably greater than 90 degrees and less than or equal to 135 degrees. More preferably, the angle θ1 is more than or equal to 125 degrees and less than or equal to 135 degrees. This makes it possible for the first peripheral parts 16b diffuse light from the light sources 15 more evenly toward the liquid crystal cell 11.

Figure 6:
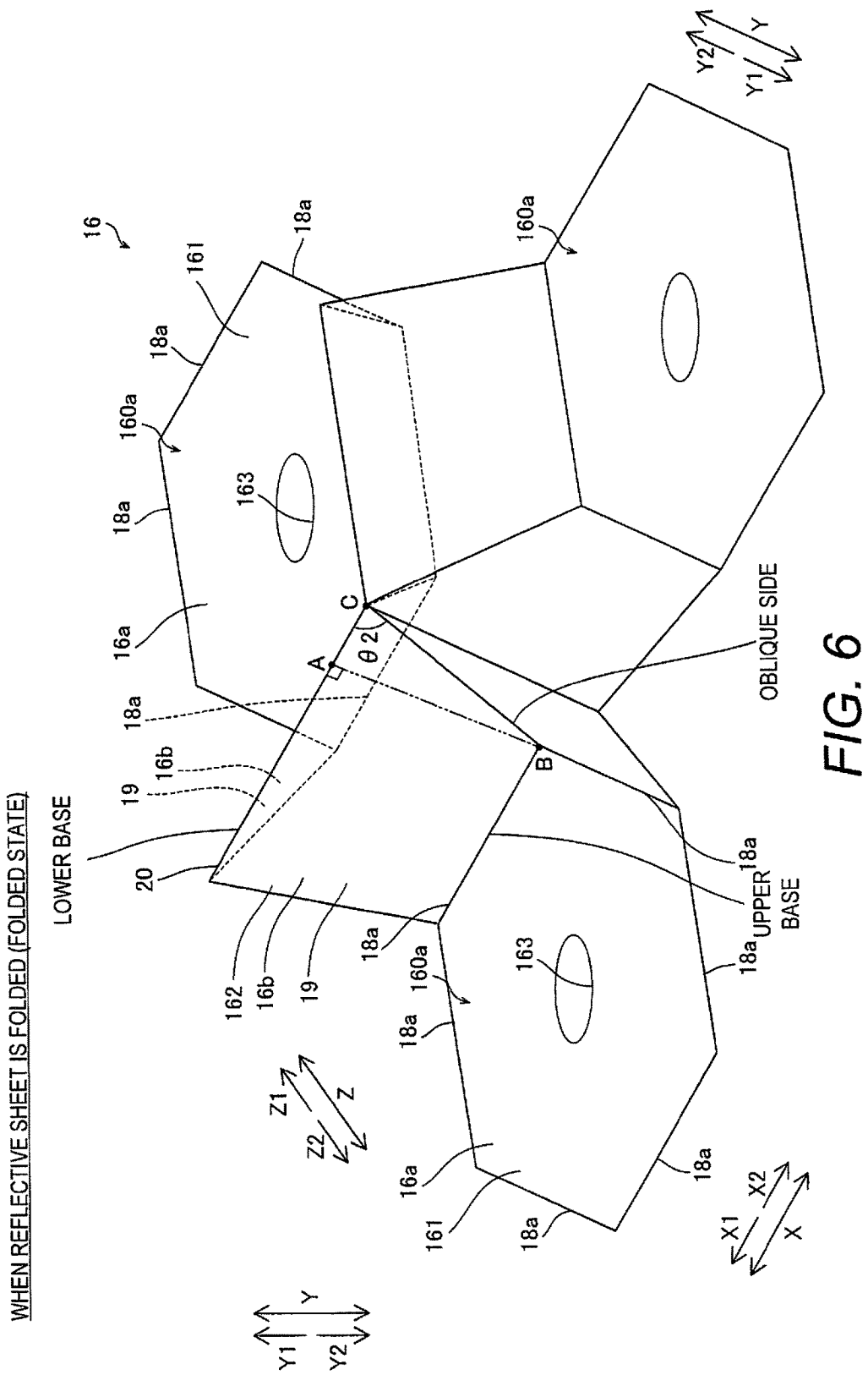
FIG. 6 is a partial front perspective view of the first bottom parts and the first peripheral parts of the reflectors in a state in which the reflective sheet has been folded.

Also, as shown in FIG. 6, the first peripheral parts 16b are formed in a trapezoidal shape each having an upper base located on the outer edge of the first bottom part 16a, and a lower base that is longer than the upper base. The angles θ2 formed by the oblique sides of the first peripheral parts 16b and the lower bases of the first peripheral parts 16b are preferably set to be greater than 60 degrees and less than 90 degrees. The oblique sides of adjacent first peripheral parts 16b contact with each other. In the illustrated embodiment, the first peripheral parts 16b are formed in an isosceles trapezoid, for example.

As shown in FIG. 5, as discussed above, the first bottom parts 16a and the first peripheral parts 16b are formed integrally from the single reflective sheet 16 (sheet-form member). That is, the first bottom parts 16a and the first peripheral parts 16b are fabricated from a single sheet-form member by folding the single sheet-form member at specific locations (valley folds 18a and peak folds (the ends 20) discussed below). The second bottom parts 16c and the second peripheral parts 16d are also formed integrally from the single reflective sheet 16 (sheet-form member) in a similar manner. Furthermore, the first reflectors 160a and the second reflectors 160b are formed integrally from the single reflective sheet 16 (sheet-form member).

Figure 7:
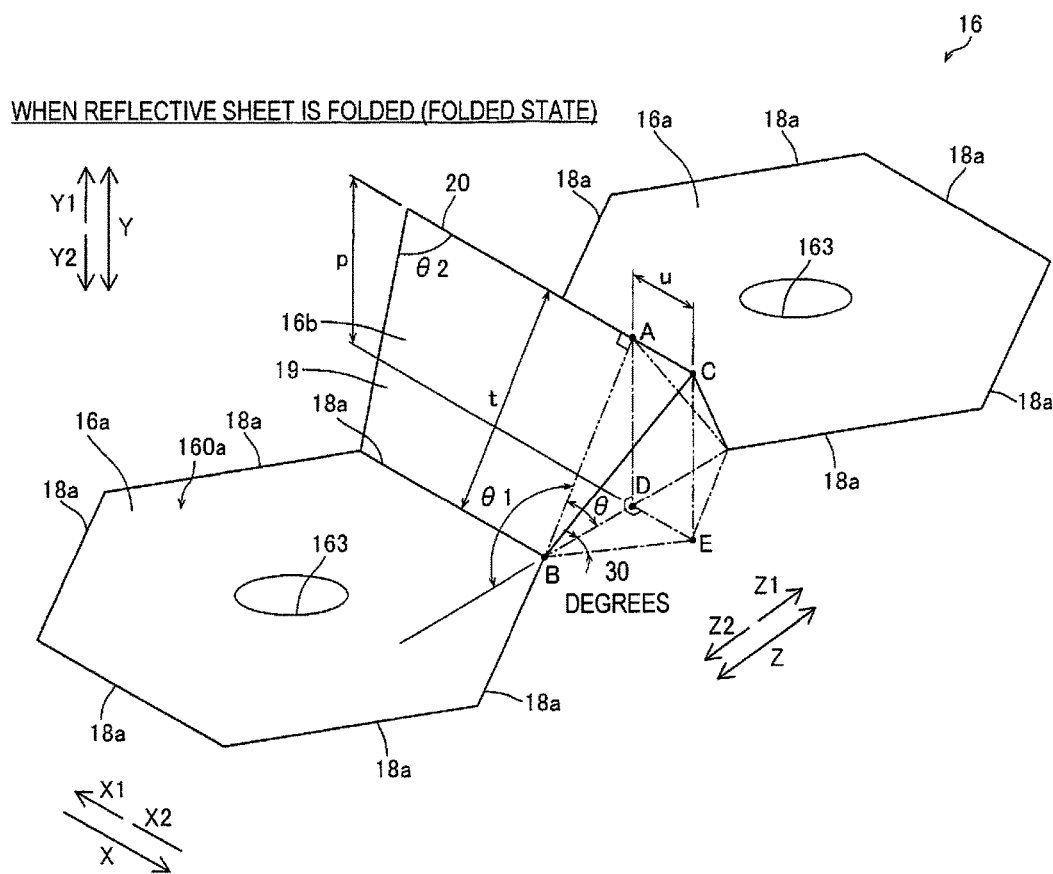
FIG. 7 is another partial front perspective view of the first bottom parts and the first peripheral parts of the reflectors shown in FIG. 6.

As shown in FIG. 6, the reflective sheet 16 (a single sheet-form member) includes hexagonal parts that form the first bottom parts 16a. Also, the reflective sheet 16 includes a plurality of connecting parts 19 that connect the first bottom parts 16a (hexagonal parts) together. The connecting parts 19 are formed by the first peripheral parts 16b. As shown in FIG. 7, the connecting parts 19 each form one face of one first peripheral part 16b, and one face of an adjacent first peripheral part 16b. Also, the connecting parts 19 are each disposed between two adjacent first bottom parts 16a and connect the two adjacent first bottom parts 16a together. Therefore, a total of six of the connecting parts 19 are disposed around each of the first bottom parts 16a. FIG. 7 shows part of the reflective sheet 16 in the folded state shown in FIG. 6.

The connecting parts 19 have valley folds 18a (the portions indicated by the small-pitch one-dot chain lines in FIG. 4) provided to the end sides (the outer edges) of the first bottom parts 16a. The connecting parts 19 are each connected to two adjacent first bottom parts 16a. Therefore, one connecting part 19 has two valley folds 18a that are parallel to each other. These valley folds 18a form the boundary between the first bottom parts 16a and the first peripheral parts 16b, as shown in FIGS. 5 to 7, in a state in which the reflective sheet 16 has been folded.

The connecting parts 19 have peak folds (the ends 20) (the portions indicated by the large-pitch one-dot chain lines in FIG. 4) each provided between adjacent first peripheral parts 16b (two valley folds 18a). The peak folds (the ends 20) are parallel to the valley folds 18a. Also, the peak folds (the ends 20) is formed by the ends 20 (vertices) of the first peripheral parts 16b on the liquid crystal cell 11 side (see FIG. 2) in a state in which the reflective sheet 16 has been folded. The ends 20 of the first peripheral parts 16b are continuously connected to the ends 20 of adjacent first peripheral parts 16b with no gap along the reflective sheet 16. One connecting part 19 connects two first bottom parts 16a via two valley folds 18a and one peak fold (end 20), and is formed by two first peripheral parts 16b.

Figure 8:
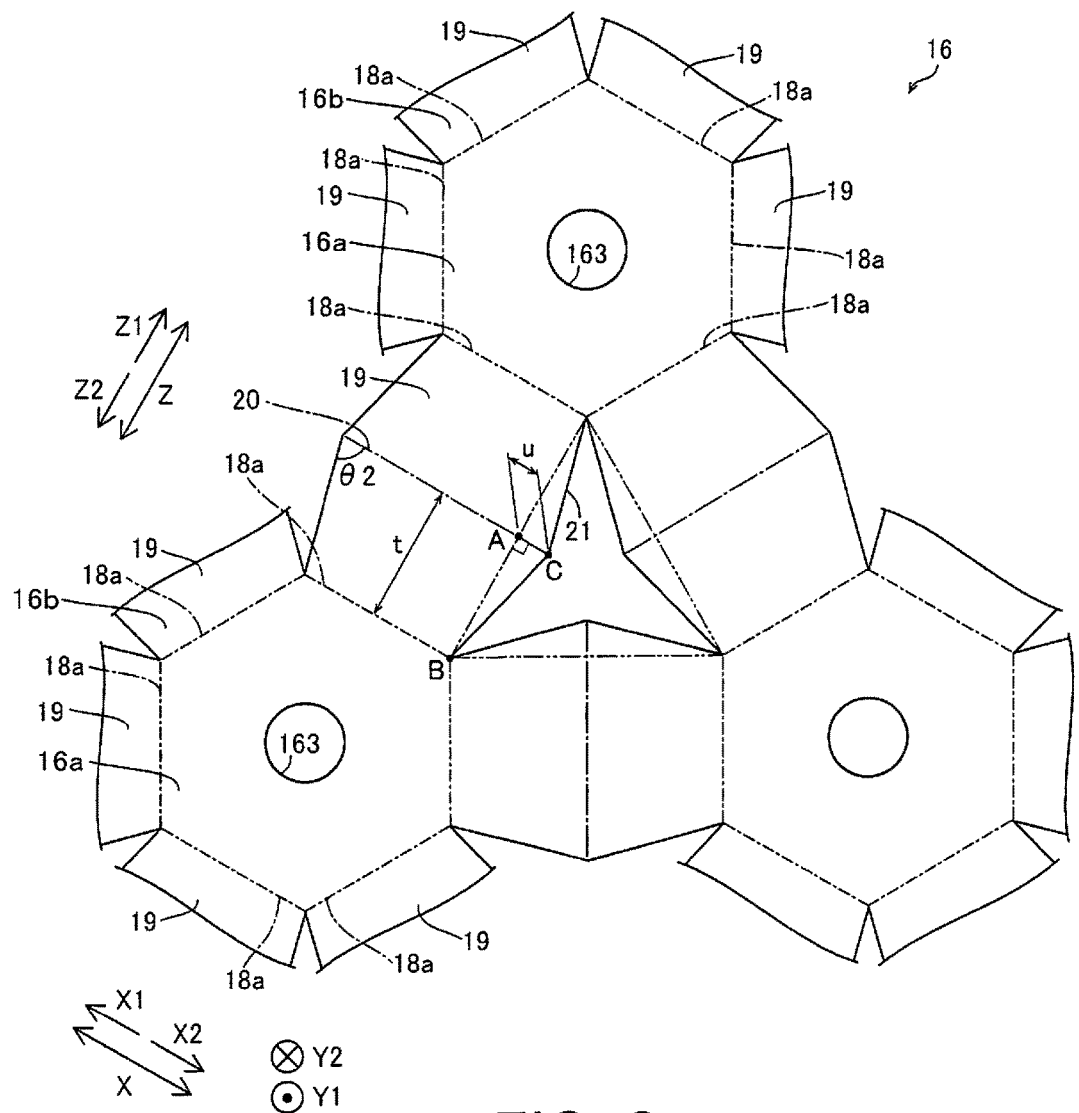
FIG. 8 is a development view of a partial plan view of the reflective sheet, illustrating the first bottom parts and the first peripheral parts of the reflectors in a state in which the reflective sheet has been unfolded.

As shown in FIG. 8, the reflective sheet 16 has a plurality of holes 21. The holes 21 are each defined inside by the boundary of three adjacent connecting parts 19. As shown in FIG. 8, the holes 21 are formed in a concave hexagonal shape when the reflective sheet 16 is unfolded (when the reflective sheet 16 is in a state in which it has not been folded at the valley folds 18a and the peak folds (the ends 20)).

More specifically, as shown in FIG. 8, each of the concave hexagonal holes 21 is formed in the reflective sheet 16 from a total of six points: three points of a regular triangle indicated by a two-dot chain line, and three points located inside the regular triangle, by having the peak folds (the ends 20) protrude to the inside of the regular triangle from the midpoints of each side of the regular triangle indicated by the two-dot chain line. The two-dot chain lines extend in a direction perpendicular to the outer edges of the first bottom parts 16a that are connected by the connecting parts 19. Therefore, the length of the two-dot chain lines is equal to the separation distance between adjacent first bottom parts 16a in an unfolded state (two times the length t discussed below). As shown in FIG. 6, the reflective sheet 16 closes up the holes 21 at the boundary between three connecting parts 19 in a state in which it has been folded at the valley folds 18a and the peak folds (the ends 20).

Referring now to FIG. 7, the configuration of the reflective sheet 16 when the reflective sheet 16 has been folded (when the holes 21 have been closed up) will now be described. Specifically, the relation between the inclination angle θ of the first peripheral parts 16b, the length 2t of the connecting parts 19, and the height p of the first peripheral parts 16b will be described. As shown in FIGS. 2 and 7, the inclination angle θ of the first peripheral parts 16b refers to the complementary angle of the angle θ1 of ∠ABD. The height p of the first peripheral parts 16b refers to the length of the first peripheral parts in the frontward and rearward direction (Y direction) from the first bottom parts 16a. In other words, the height p is the distance (length between points AD in FIG. 7) in the frontward and rearward direction from the first bottom parts 16a to the ends 20 of the first peripheral parts 16b.

In FIG. 8, point A is the center of the two-dot chain line. Point B is one end of the two-dot chain line. Point C is the vertex of the peak fold (the end 20) protruding to the inside of the hole 21 from the two-dot chain line. As shown in FIG. 7, in a state in which the reflective sheet 16 has been folded (the holes 21 have been closed up), the points where points A and C are projected into the plane in which the first bottom parts 16a lie shall be termed point D and point E, respectively. In the following description, the length between the points AB is termed t (half of the size 2t of the connecting parts 19 in the lengthwise direction). The length between points AC is termed u.

Here, the ∠DBE shown in FIG. 7 is always 30 degrees. This is because, as seen from the front (as seen in the Y1 direction), the regular triangle indicated by the two-dot chain line in FIG. 8 showing the reflective sheet 16 in an unfolded state, and the regular triangle indicated by the two-dot chain line in FIG. 5 showing the reflective sheet 16 in a folded state are always similar figures, and in FIG. 5, point C (point E) is located in the center of the regular triangle. That is, this is because, when viewed from the front, the ∠ABC and the ∠DBE are superposed, and the ∠ABC corresponds to half of one of the corners (60 degrees) constituting the regular triangle. Here, with the right triangle DBE shown in FIG. 7, the length between the points DE is equal to the length between the points AC, and is therefore u. Also, the length between the points BD is u×√3. Therefore, there is a relationship of t×cos θ=u×√3 between the length t between the points AB, the length between the points BD, and the angle θ of the ∠ABD.

Based on this relationship, the larger is the length t with respect to the length u (the greater value the length is designed to be), the larger is the angle θ. Specifically, in this case, the height or distance p of the first peripheral parts 16b from the first bottom parts 16a becomes greater. Conversely, the smaller is the length t with respect to the length u (the less value the length is designed to be), the smaller is the angle θ (the larger is the angle θ1 of the ∠ABD).

As the angle θ approaches 90 degrees, the height or distance p of the first peripheral parts 16b (the length between the points AD) approaches t. In other words, the closer the concave hexagonal holes 21 are to the regular triangular shape indicated by the two-dot chain line (see FIG. 8) (the smaller is the protruding length (the length between the points AC) of the peak folds (ends 20) from the two-dot chain line, the larger is the angle θ (the smaller is the angle θ1 of the ∠ABD).

As shown in FIG. 2, the ends 20 of the first peripheral parts 16b are disposed more to the front (in the Y1 direction) than the light sources 15. That is, as shown in FIG. 2, the distance p from the first bottom parts 16a to the ends 20 in the frontward and rearward direction (Y direction) is greater than the length q of the light sources 15 from the first bottom parts 16a. In the illustrated embodiment, the length q is the length from the surface 161 of the first bottom parts 16a to the frontmost portions of the light sources 15.

The separation distance between the first bottom parts 16a and the optical sheet 13 here is termed r. The ends 20 are separated from the optical sheet 13. The separation distance h is preferably more than or equal to 0.2r and less than or equal to 0.8r. More preferably, the separation distance h is more than or equal to 0.2r and less than or equal to 0.5r. That is, the ends 20 are preferably disposed on the side closer to the optical sheet 13 than the first bottom parts 16a.

As shown in FIG. 1, the second peripheral parts 16d are disposed so as to surround the periphery of each of the light sources 15. Also, the second peripheral parts 16d extend frontward from the outer edges of the second bottom parts 16c toward the liquid crystal cell 11. In the illustrated embodiment, the second bottom parts 16c has a pentagonal or tetragonal shape. Thus, five second peripheral parts 16d are provided around each of the pentagonal second bottom parts 16c, while four second peripheral parts 16d are provided around each of the tetragonal second bottom parts 16c. In the illustrated embodiment, as shown in FIG. 1, the second reflectors 160b with the pentagonal second bottom parts 16c are arranged in the reflective sheet 16 along the short sides of the liquid crystal cell 11. The second reflectors 160b with the tetragonal second bottom parts 16c are arranged in the reflective sheet 16 along the long sides of the liquid crystal cell 11.

The surface area S1 of the region surrounded by the second peripheral parts 16d (i.e., the surface area S1 of the second bottom parts 16c) is smaller than the surface area S2 of the region surrounded by the first peripheral parts 16b (i.e., the surface area S2 of the first bottom parts 16a). For the second bottom parts 16c with the surface area S1, the light sources 15 are disposed on the second bottom parts 16c at locations slightly to the inside of the liquid crystal cell 11 so as not to overlap the edges 11c of the liquid crystal cell 11, as described above. Therefore, the second peripheral parts 16d that surround the second bottom parts 16c with the surface area S1 have a shape according to the shape of the second bottom parts 16c (pentagonal shape or tetragonal shape). In the illustrated embodiment, the surface area S1 has two kinds of surface areas: the surface area S11 of pentagonal regions (second bottom parts 16c) and the surface area S12 of tetragonal regions (second bottom parts 16c). The surface area S11 is larger than the surface area S12.

As shown in FIG. 2, the display device 100 includes one light intensity adjuster 17. The light intensity adjuster 17 is electrically connected to each of the light sources 15. The light intensity adjuster 17 is configured to individually adjust the light intensity of the light sources 15 (the light emitting elements 151). Also, the light intensity adjuster 17 is configured so that the light intensity of the light sources 15 surrounded by the second peripheral parts 16d will be lower than the light intensity of the light sources 15 surrounded by the first peripheral parts 16b. More precisely, the light intensity adjuster 17 is configured so as to adjust the light intensity of the light sources 15 according to (proportionally to) the surface area S2 of the regions surrounded by the first peripheral parts 16b and the surface area S1 (S11 and S12) of the regions surrounded by the second peripheral parts 16d. In the illustrated embodiment, the light intensity adjuster 17 can include an electric circuit, such as a LED driver. For example, the light intensity adjuster 17 can include a LED driver with PWM control.

More specifically, the light intensity adjuster 17 is configured so that the light intensity of the light sources 15 surrounded by the second peripheral parts 16d is made lower than the light intensity of the light sources 15 surrounded by the first peripheral parts 16b by adjusting the duty ratio. For example, the light intensity adjuster 17 adjust the duty ratio so that the light sources 15 inside the second peripheral parts 16d surrounding the regions with the surface area S12 (half the surface area S2) will have an intensity that is half the light intensity of the light sources 15 surrounded by the first peripheral parts 16b. The light intensity can also be adjusted by changing the power supplied to the light sources 15, rather than using the duty ratio.

Effect of First Embodiment

The following effect can be obtained with the first embodiment.

With the first embodiment, as discussed above, the display device 100 includes the first reflectors 160a and the optical sheet 13. The first reflectors 160a are configured such that the surfaces 161 of the first bottom parts 16a and the surfaces 162 of the first peripheral parts 16b form the obtuse angle. The optical sheet 13 is disposed between the liquid crystal cell 11 and the first reflectors 160a. Consequently, part of the light from the light sources 15 that has a relatively large angle with respect to a direction perpendicular to the rear face 11b of the liquid crystal cell 11 is reflected at the first peripheral parts 16b that form the obtuse angle with the first bottom parts 16a. This produces more light that travels along the direction perpendicular to the rear face 11b of the liquid crystal cell 11. Thus, there will be less leakage of light from the gaps between the optical sheet 13 and the first reflectors 160a into the regions corresponding to other light sources 15 on the liquid crystal cell 11. As a result, there is sharper contrast between the regions corresponding to the various light sources 15 on the liquid crystal cell 11. Also, the light can be reflected by the first bottom parts 16a towards the liquid crystal cell 11. Thus, brightness can be effectively increased, and the contrast ratio of the liquid crystal cell 11 can be improved.

Also, with the first embodiment, as discussed above, the first reflectors 160a are arranged with respect to each other at a substantially equal interval or spacing. Consequently, the first reflectors 160a and the light sources 15 can be disposed at a substantially equal interval or spacing. Thus, there will be less brightness unevenness between the regions corresponding to the various light sources 15 (or corresponding to the first reflectors 160a).

Also, with the first embodiment, as discussed above, the first bottom parts 16a have a polygonal shape. Specifically, the first bottom parts have a regular hexagonal shape, and contacts with the sides of adjacent first peripheral parts 16b. Consequently, there will be less leakage of light from portions between the first bottom parts and the sides of the adjacent first peripheral parts 16b. Thus, brightness will be decreased less by the leakage of light.

Also, with the first embodiment, as discussed above, the first reflectors 160a are integrally formed with respect to each other. Consequently, the first reflectors 160a can be formed more easily than when the first reflectors 160a are formed separately.

Also, with the first embodiment, as discussed above, the distances h between the optical sheet 13 and the ends 20 of the first peripheral parts 16b on the optical sheet 13 side are substantially equal to each other. Consequently, there will be less brightness unevenness between the regions corresponding to the light sources 15 (or corresponding to the first reflectors 160a) than when the distances between the optical sheet 13 and the ends of the first peripheral parts 16b on the optical sheet 13 side are set to various distances.

Also, with the first embodiment, as discussed above, the first bottom parts 16a and the first peripheral parts 16b are arranged to satisfy the following condition: $90°<\theta 1 \leq 135°$ where $\theta 1$ represents the obtuse angle. Consequently, the light from the light sources 15 can be reflected toward the optical sheet 13 at a favorable angle.

Also, with the first embodiment, as discussed above, the first bottom parts 16a and the first peripheral parts 16b are arranged to further satisfy the following condition: $125° \leq \theta 1 \leq 135°$. Consequently, the light from the light sources 15 can be reflected toward the optical sheet 13 at a more favorable angle.

Also, with the first embodiment, as discussed above, the first reflectors 160a and the optical sheet 13 are arranged to satisfy the following condition: $0.2r \leq h \leq 0.8r$ where r represents the distance between the first bottom parts 16a and the optical sheet 13, and h represents the specific distance between the optical sheet 13 and the first reflectors 160a.

Also, with the first embodiment, as discussed above, the first reflectors 160a and the optical sheet 13 are arranged to satisfy the following condition: $0.2r \leq h \leq 0.5r$ where r represents the distance between the first bottom parts 16a and the optical sheet 13, and h represents the specific distance between the optical sheet 13 and the first reflectors 160a.

Also, with the first embodiment, as discussed above, the distance between the first bottom parts 16a and the ends 20 of the first peripheral parts 16b on the optical sheet 13 side in a direction perpendicular to the surfaces 161 of the first bottom parts 16a is longer than the distance between the first bottom parts 16a and the ends 20 of the light sources 15 on the optical sheet 13 side. Consequently, the ends 20 of the first peripheral parts 16b on the optical sheet 13 side are disposed between the liquid crystal cell 11 and the light sources 15. Thus, more light is reflected from the first reflectors 160a. Also, the light reflection direction can be adjusted better than when the light sources 15 are disposed between the liquid crystal cell 11 and the ends 20 of the first peripheral parts 16b on the optical sheet 13 side. As a result, there will be less leakage of light into adjacent regions, while sharper contrast can be obtained at the liquid crystal cell 11.

Also, with the first embodiment, as discussed above, the first peripheral parts 16b have a trapezoidal shape with the upper base that is located on the outer edge of the first bottom parts 16a and the lower base that is longer than the upper base.

Also, with the first embodiment, as discussed above, the first peripheral parts 16b are formed to satisfy the following condition: $60° < \theta 2 < 90°$ where $\theta 2$ represents an angle formed between the lower base and an oblique side of the trapezoidal shape.

Also, with the first embodiment, as discussed above, the oblique sides of adjacent first peripheral parts 16b contacts with each other. Consequently, the adjacent first peripheral parts 16b are disposed so that they are in contact at their oblique sides with respect to each other. This allows the first peripheral parts 16b to be disposed surrounding the first bottom parts 16a without any gaps.

Also, with the first embodiment, as discussed above, the liquid crystal cell 11 is formed in a rectangular shape. The outer edges of the first bottom parts 16a extend parallel to the long sides of the liquid crystal cell 11. Consequently, the first reflectors 160a are each arranged so that when a pair of opposing sides of the hexagonal shape extends in the lateral direction of the display face 11a, the light sources 15 are lined up linearly adjacent in the longitudinal direction. Thus, the light intensity adjustment, such as varying the transmissivity of the liquid crystals for each row of the light sources 15, can be performed along the direction in which the light sources 15 are arranged. As a result, there will be less brightness unevenness within a row of light sources 15.

Also, with the first embodiment, as discussed above, the liquid crystal cell 11 is formed in a rectangular shape. The display device 100 further includes the second reflectors 160b that are disposed along the peripheral side (e.g., the long sides and the short sides) of the liquid crystal cell 11. The second reflectors 160b each have the second bottom part 16c that has a pentagonal or tetragonal shape and a second peripheral part 16d that extends from the outer edges of the second bottom part 16c toward the rear face 11b. The second bottom parts 16c has the surface area S1 that is smaller than the surface area S2 of the first bottom parts 16a. Consequently, the first reflectors 160a having first bottom parts 16a with the regular hexagonal shape and the second reflectors 160b having the second bottom parts 16c with the pentagonal or tetragonal shape can be laid edge to edge in a rectangular shape. Thus, a configuration (the reflective sheet 16) for reflecting the light from the light sources 15 without any gaps can be disposed on the rear face 11b side of the liquid crystal cell 11. As a result, the light from the light sources 15 can be efficiently reflected towards the liquid crystal cell 11 side.

Also, with the first embodiment, as discussed above, the light sources 15 include the light sources 15 disposed on the surfaces 161 of the first bottom parts 16a and the light sources 15 disposed on the surfaces 164 of the second bottom parts 16c. The display device 100 further includes the light intensity adjuster 17. The light intensity adjuster 17 is configured to adjust the light intensity of the light sources 15 such that the light intensity of the light sources 15 disposed on the surfaces 164 of the second bottom parts 16c is less than the light intensity of the light sources 15 disposed on the surfaces 161 of the first bottom parts 16a. Consequently, the light intensity can be reduced for the light sources 15 that are disposed on the second bottom part 16c, which has a smaller surface area. Thus, there will be less brightness unevenness attributable to the light sources 15 near the peripheral edges 11c (outside part) of the liquid crystal cell 11 and the light sources 15 near the center (inside part) of the liquid crystal cell 11. In other words, there will be less brightness unevenness attributable to the size (surface area) of the regions where the light sources 15 are disposed.

Also, with the first embodiment, as discussed above, the light intensity adjuster 17 is configured to adjust the light intensity of the light sources 15 based on the duty ratio or the amount of power supplied to the light sources 15. Consequently, the light intensity of the light sources 15 can be easily adjusted by adjusting the duty ratio or the amount of power supplied to the light sources 15.

Also, with the first embodiment, as discussed above, the first reflectors 160a and the second reflectors 160b are integrally formed with respect to each other. Consequently, fewer parts will be needed and the device configuration can be simpler than when the first reflectors 160a and the second reflectors 160b are configured separately.

Second Embodiment

A second embodiment will now be described through reference to FIGS. 1 and 9. In the first embodiment above, the light from the light emitting elements 151 is emitted substantially uniformly in the peripheral direction by providing the lens components 15b. On the other hand, in the second embodiment, the light from the light emitting elements 151 is emitted substantially uniformly in the peripheral direction without providing lens components.

Figure 9:
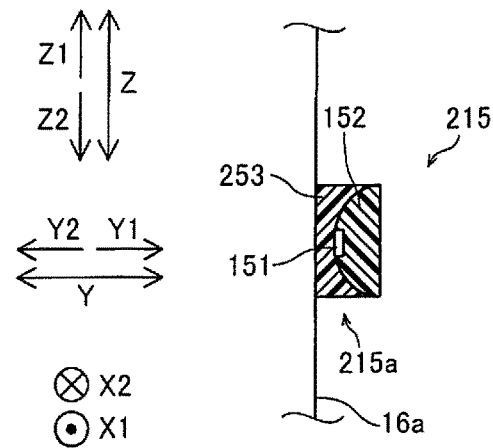
FIG. 9 is a cross sectional view of a light source of a display device in accordance with a second embodiment.

As shown in FIG. 9, with the display device 200 in accordance with the second embodiment (see FIG. 1), light sources 215 each include a light emitting element package 215a having a light emitting element 151, a sealing component 152, and a reflector 253 disposed to the rear of the light emitting element 151 and the sealing component 152.

The reflectors 253 are formed in a circular shape. The reflectors 253 are configured to reflect light from the light emitting elements 151 substantially uniformly in the peripheral direction. The light reflected in the peripheral direction by the reflectors 253 mainly shines on the optical sheet 13 and the first peripheral parts 16b (or the second peripheral parts 16d).

The rest of the configuration of the second embodiment is the same as in the first embodiment above.

Effect of Second Embodiment

The following effect can be obtained with the second embodiment.

With the second embodiment, just as in the first embodiment above, the display device 200 includes the first reflectors 160a and the optical sheet 13. The first reflectors 160a are configured such that the surfaces 161 of the first bottom parts 16a and the surfaces 162 of the first peripheral parts 16b form the obtuse angle. The optical sheet 13 is disposed between the liquid crystal cell 11 and the first reflectors 160a. Consequently, there will be less leakage of light from the gaps between the optical sheet 13 and the first reflectors 160a into the regions corresponding to other light sources 15 on the liquid crystal cell 11. As a result, there is sharper contrast between the regions corresponding to the various light sources 15 on the liquid crystal cell 11.

The rest of the effect of the second embodiment is the same as in the first embodiment above.

Third Embodiment

A third embodiment will now be described through reference to FIG. 1. In the first embodiment above, the first bottom parts 16a, the first peripheral parts 16b, the second bottom parts 16c and the second peripheral parts 16d are formed by folding a single reflective sheet 16. On the other hand, in the third embodiment, the first bottom parts 16a, the first peripheral parts 16b, the second bottom parts 16c and the second peripheral parts 16d are formed by integral molding using a metal mold.

As shown in FIG. 1, the display device 300 in accordance with the third embodiment (see FIG. 1) includes a reflective member 316. The first bottom parts 16a, the first peripheral parts 16b, the second bottom parts 16c and the second peripheral parts 16d are formed integrally with the reflective member 316 by injection molding using a metal mold. More specifically, the first bottom parts 16a, the first peripheral parts 16b, the second bottom parts 16c and the second peripheral parts 16d are integrally formed by casting a resin with the molding machine of a metal mold having a cavity corresponding to the shape.

The rest of the configuration of the third embodiment is the same as in the first embodiment above.

Effect of Third Embodiment

The following effect can be obtained with the third embodiment.

With the third embodiment, just as in the first embodiment above, the display device 300 includes the first reflectors 160a and the optical sheet 13. The first reflectors 160a are configured such that the surfaces 161 of the first bottom parts 16a and the surfaces 162 of the first peripheral parts 16b form the obtuse angle. The optical sheet 13 is disposed between the liquid crystal cell 11 and the first reflectors 160a. Consequently, there will be less leakage of light from the gaps between the optical sheet 13 and the first reflectors 160a into the regions corresponding to other light sources 15. As a result, there is sharper contrast between the regions corresponding to the various light sources 15 on the liquid crystal cell 11.

The rest of the effect of the third embodiment is the same as in the first embodiment above.

Modification Examples

The embodiments disclosed herein are in all respects nothing more than mere examples, and should not be interpreted as limiting in nature. The scope of the present invention is as indicated by the claims, and not by the descriptions given in the above embodiments. Furthermore, all modifications (modification examples) within the meaning and range of equivalency of the claims are included.

Figure 10:
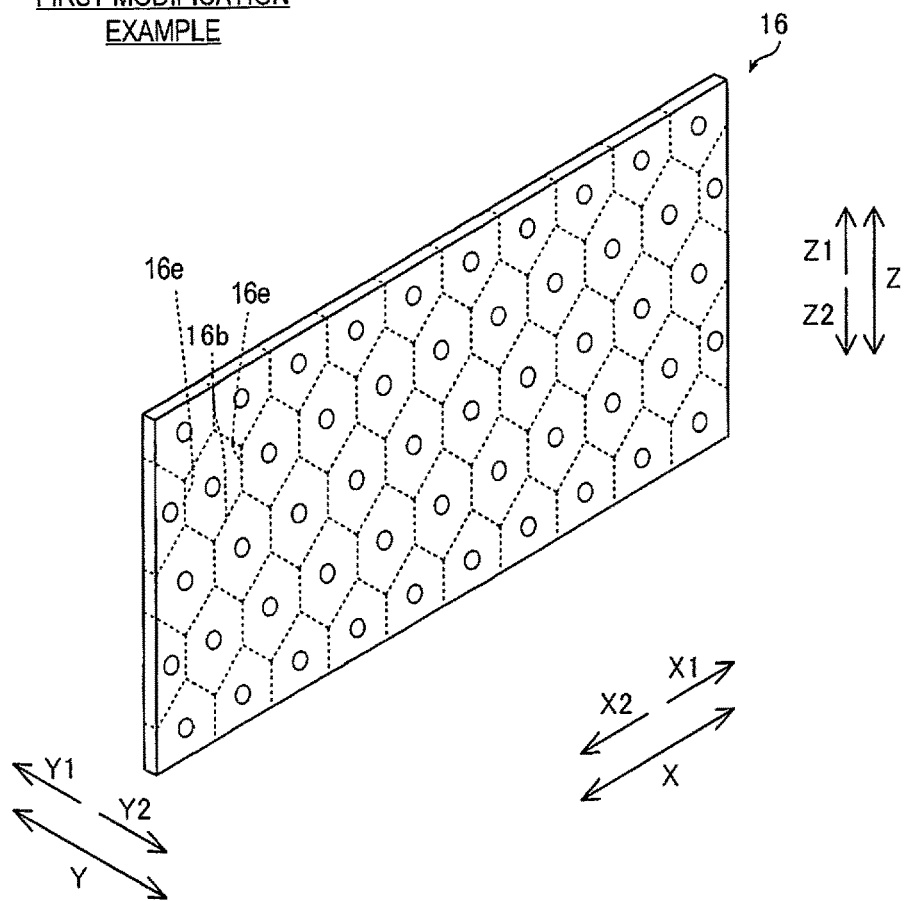
FIG. 10 is a schematic perspective view of a reflective sheet in a display device in accordance with to a first modification example.

For example, in the first to third embodiments above, the first peripheral parts 16b are each configured so that the pair of opposing sides 16e of the hexagonal shape extends in the lateral direction (X direction) of the liquid crystal cell 11. However, the present invention is not limited to this. With the first modification example of the present disclosure, as shown in FIG. 10, the first peripheral parts 16b can be each configured so that the pair of opposing sides 16e of the hexagonal shape extend in the longitudinal direction (Z direction) of the liquid crystal cell 11 (see FIG. 1).

Also, in the first to third embodiments above, the separation distance h between the optical sheet 13 and the ends of the first peripheral parts 16b on the liquid crystal cell 11 side is less than half the separation distance r between the first bottom parts 16a and the optical sheet 13. However, the present invention is not limited to this. With the present invention, the separation distance h between the optical sheet 13 and the ends of the first peripheral parts 16b on the liquid crystal cell 11 side can be greater than half the separation distance h between the first bottom parts 16a and the optical sheet 13.

Also, in the first to third embodiments above, the light intensity of the light sources 15 surrounded by the second peripheral parts 16d (e.g., edge wall-shaped reflectors) is adjusted by the light intensity adjuster 17 to be less than the light intensity of the light sources 15 surrounded by the first peripheral parts 16b. However, the present invention is not limited to this. With the present invention, adjustment with the light intensity adjuster 17 does not always need to be performed.

Also, in the first to third embodiments above, the specific spacing h between the first reflectors 160a and the optical sheet 13 is set to at least 0.2r and no more than 0.8r (more preferably, at least 0.2r and no more than 0.5r). However, the present invention is not limited to this. With the present invention, the specific spacing h can, for example, be set to a range outside the range of at least 0.2r and no more than 0.8r, such as greater than zero and no more than 0.04r. Thus, the first reflectors 160a and the optical sheet 13 can be arranged to satisfy the following condition: $0<h\leq 0.04r$ where r represents the distance between the first bottom parts 16a and the optical sheet 13, and h represents the specific distance between the optical sheet 13 and the first reflectors 160a.

Also, in the first to third embodiments above, the light intensity of the light sources 15 is adjusted by varying the duty ratio with the light intensity adjuster 17. However, the present invention is not limited to this. With the present invention, the light intensity of the light sources 15 can be adjusted by adjusting the amount of power supplied to the light sources 15 with the light intensity adjuster 17.

Also, in the first to third embodiments above, the first bottom parts 16a are formed in the regular hexagonal shape. However, the present invention is not limited to this. With the present invention, the first bottom part 16a need not be formed in the regular hexagonal shape. For instance, the first bottom parts can be formed in a regular triangular shape.

[1] In view of the state of the know technology and in accordance with a first aspect, a display device includes a display, a plurality of first reflectors, a light processing member, and a plurality of light sources. The first reflectors each have a first bottom part that is disposed on a rear face side of the display and a first peripheral part that extends from an outer edge of the first bottom part toward a rear face of the display. A surface of the first bottom part and a surface of the first peripheral part form an obtuse angle. The light processing member is disposed between the display and the first reflectors. The light processing member is spaced apart from the first reflectors by a specific distance. The light sources are disposed relative to the surfaces of the first bottom parts, respectively.

With this display device, the first reflectors are provided in each of which the surface of the first bottom part and the surface of the first peripheral part form the obtuse angle. Also, the light processing member is disposed between the display and the first reflectors. The obtuse angle is formed by light reflecting surfaces of the first bottom part and the corresponding peripheral part. The light reflecting surfaces of the first bottom part and the corresponding peripheral part face to the light processing member. The light reflecting surfaces of the first bottom part and the corresponding peripheral part are disposed to reflect light from the corresponding light source toward the light processing member. Consequently, part of light from the light sources that has a relatively large angle with respect to a direction that is perpendicular to the rear face of the display is reflected by the first peripheral parts, which form the obtuse angle with the first bottom parts. This produces more light that travels along the direction perpendicular to the rear face of the display. Thus, less light leaks out from the gap between the light processing member and the first reflectors into the regions corresponding to other light sources. As a result, sharper contrast can be achieved between the regions corresponding to the light sources on the display. Also, more light can be reflected by the first bottom parts towards the display. Thus, the brightness can be effectively increased, and the contrast ratio of the display can be improved.

[2] In accordance with a preferred embodiment according to the display device mentioned above, the first reflectors are arranged with respect to each other at a substantially equal interval. With this configuration, the first reflectors and the light sources are disposed at a substantially equal interval. Thus, there will be less unevenness in brightness between the regions corresponding to the light sources (or corresponding to the first reflectors).

[3] In accordance with a preferred embodiment according to any one of the display devices mentioned above, the first bottom parts have a polygonal shape.

[4] In accordance with a preferred embodiment according to any one of the display devices mentioned above, the first bottom parts have a regular hexagonal shape, and contact with sides of adjacent first peripheral parts. With this configuration, there will be less leakage of light from portions between the first bottom parts and the sides of the adjacent first peripheral parts. Thus, the decrease in brightness caused by the light leakage can be reduced.

[5] In accordance with a preferred embodiment according to any one of the display devices mentioned above, the first reflectors are integrally formed with respect to each other. With this configuration, the first reflectors can be formed more easily than when a plurality of first reflectors are formed individually.

[6] In accordance with a preferred embodiment according to any one of the display devices mentioned above, distances between the light processing member and ends of the first peripheral parts on a light processing member side are substantially equal to each other. With this configuration, there will be less brightness unevenness in the regions corresponding to the light sources (or corresponding to the first reflectors) than when the distances between the light processing member and the ends of the first peripheral parts on the light processing member side have a variety of distances.

[7] In accordance with a preferred embodiment according to any one of the display devices mentioned above, the first bottom parts and the first peripheral parts are arranged to satisfy the following condition: $90°<\theta 1\leq 135°$ where $\theta 1$ represents the obtuse angle. With this configuration, the light from the light sources can be reflected at a more favorable angle toward the light processing member.

[8] In accordance with a preferred embodiment according to any one of the display devices mentioned above, the first bottom parts and the first peripheral parts are arranged to further satisfy the following condition: $125°\leq \theta 1\leq 135°$. With this configuration, the light from the light sources can be reflected at a more favorable angle toward the light processing member.

[9] In accordance with a preferred embodiment according to any one of the display devices mentioned above, the first reflectors and the light processing member are arranged to satisfy the following condition: $0.2r\leq h\leq 0.8r$ where r represents a distance between the first bottom parts and the light processing member, and h represents the specific distance.

[10] In accordance with a preferred embodiment according to any one of the display devices mentioned above, the first reflectors and the light processing member are arranged to satisfy the following condition: $0.2r\leq h\leq 0.5r$ where r represents a distance between the first bottom parts and the light processing member, and h represents the specific distance.

[11] In accordance with a preferred embodiment according to any one of the display devices mentioned above, the first reflectors and the light processing member are arranged to satisfy the following condition: $0<h\leq 0.04r$ where r represents a distance between the first bottom parts and the light processing member, and h represents the specific distance.

[12] In accordance with a preferred embodiment according to any one of the display devices mentioned above, a distance between the first bottom parts and ends of the first peripheral parts on the light processing member side in a direction perpendicular to the surfaces of the first bottom parts is longer than a distance between the first bottom parts and ends of the light sources on the light processing member side. With this configuration, the ends of the first peripheral parts on the light processing member side can be disposed between the display and the light sources. Thus, more light can be reflected from the first reflectors. Also, a light reflection direction can be adjusted better than when the light sources are disposed between the display and the ends of the first peripheral parts on the light processing member side. As a result, there will be less leakage of light to adjacent regions, while a sharper contrast can be obtained at the display.

[13] In accordance with a preferred embodiment according to any one of the display devices mentioned above, the first peripheral parts have a trapezoidal shape with an upper base that is located on the outer edge and a lower base that is longer than the upper base.

[14] In accordance with a preferred embodiment according to any one of the display devices mentioned above, the first peripheral parts are formed to satisfy the following condition: $60°<\theta 2<90°$ where $\theta 2$ represents an angle formed between the lower base and an oblique side of the trapezoidal shape.

[15] In accordance with a preferred embodiment according to any one of the display devices mentioned above, with the configuration in which the first peripheral parts are formed in the trapezoidal shape with the upper base and the lower base, oblique sides of adjacent first peripheral parts contact with each other. With this configuration, the adjacent first peripheral parts are disposed so that they are in contact at their oblique sides with respect to each other. This allows them to be disposed so as to surround the first bottom parts without any gaps.

[16] In accordance with a preferred embodiment according to any one of the display devices mentioned above, with the configuration in which the first bottom parts are formed in the regular hexagonal shape, the display has a rectangular shape. The outer edge extends parallel to a long side or a short side of the display. With this configuration, when a pair of opposing sides of the hexagonal shape for the first reflectors extend in the longitudinal direction (or the lateral direction) of the display (the lateral direction), the light sources can be arranged so as to be linearly adjacent to each other along the lateral direction (or the longitudinal direction). Thus, the light intensity adjustment, such as varying the transmissivity of the liquid crystals for each row of the light sources, can be performed along the direction in which the light sources are arranged. As a result, there will be less brightness unevenness within a row of the light sources.

[17] In accordance with a preferred embodiment according to any one of the display devices mentioned above, with the configuration in which the first bottom parts are formed in the regular hexagonal shape, the display has a rectangular shape. The display device further includes a plurality of second reflectors. The second reflectors are disposed along a peripheral side (e.g., the long side or the short side) of the display. The second reflectors each have a second bottom part that has a pentagonal or tetragonal shape and a second peripheral part that extends from an outer edge of the second bottom part toward the rear face. The second bottom parts have a surface area that is smaller than a surface area of the first bottom parts. With this configuration, the first reflectors having the first bottom parts with the regular hexagonal shape and the second reflectors having the second bottom parts with the pentagonal or tetragonal shape can be laid edge to edge in a rectangular shape. Thus, a configuration (a reflector) for reflecting the light from the light sources without any gaps can be disposed on the rear face side of the display. As a result, the light from the light sources can be efficiently reflected towards the display.

[18] In accordance with a preferred embodiment according to any one of the display devices mentioned above, the light sources include light sources disposed at the surfaces of the first bottom parts and light sources disposed at surfaces of the second bottom parts. The display device further includes a light intensity adjuster. The light intensity adjuster is configured to adjust light intensity of the light sources such that light intensity of the light sources disposed at the surfaces of the second bottom parts is less than light intensity of the light sources disposed at the surfaces of the first bottom parts. With this configuration, the light intensity can be reduced for the light sources that are disposed at the second bottom part, which has a smaller surface area. Thus, there will be less brightness unevenness attributable to the light sources near the peripheral edges (outside part) of the display and the light sources near the center (inside part) of the display.

[19] In accordance with a preferred embodiment according to any one of the display devices mentioned above, with the configuration in which the above-mentioned light intensity adjuster is provided, the light intensity adjuster is configured to adjust the light intensity of the light sources based on an amount of power supplied to the light sources or a duty ratio. With this configuration, the light intensity of the light sources can be easily adjusted by adjusting the duty ratio or the amount of power supplied to the light sources.

[20] In accordance with a preferred embodiment according to any one of the display devices mentioned above, with the configuration in which the above-mentioned second reflectors each having the second bottom part and the second peripheral part are provided, the first reflectors and the second reflectors are integrally formed with respect to each other. With this configuration, fewer parts will be needed and the device configuration can be simpler than when the first reflectors and the second reflectors are configured separately.

With the present invention, as discussed above, there is provided a display device with which the leakage of light to the regions corresponding to other light sources from gaps between the light processing member and the first reflectors is reduced. As a result, sharper contrast between the regions corresponding to the various light sources on the display can be achieved.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts unless otherwise stated.

As used herein, the following directional terms "forward", "rearward", "front", "rear", "up", "down", "above", "below", "upward", "downward", "top", "bottom", "side", "vertical", "horizontal", "perpendicular" and "transverse" as well as any other similar directional terms refer to those directions of a display device in an upright position. Accordingly, these directional terms, as utilized to describe the display device should be interpreted relative to a display device in an upright position on a horizontal surface. The terms "left" and "right" are used to indicate the "right" when referencing from the right side as viewed from the front of the display device, and the "left" when referencing from the left side as viewed from the front of the display device.

The term "attached" or "attaching", as used herein, encompasses configurations in which an element is directly secured to another element by affixing the element directly to the other element; configurations in which the element is indirectly secured to the other element by affixing the element to the intermediate member(s) which in turn are affixed to the other element; and configurations in which one element is integral with another element, i.e. one element is essentially part of the other element. This definition also applies to words of similar meaning, for example, "joined", "connected", "coupled", "mounted", "bonded", "fixed" and their derivatives. Finally, terms of degree such as "substantially", "about" and "approximately" as used herein mean an amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, unless specifically stated otherwise, the size, shape, location or orientation of the various components can be changed as needed and/or desired so long as the changes do not substantially affect their intended function. Unless specifically stated otherwise, components that are shown directly connected or contacting each other can have intermediate structures disposed between them so long as the changes do not substantially affect their intended function. The functions of one element can be performed by two, and vice versa unless specifically stated otherwise. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A display device comprising:
   a display;
   a reflective sheet including a plurality of first reflectors each having a first bottom part that is disposed on a rear face side of the display and a plurality of first peripheral parts that extend from outer edges of the first bottom part toward a rear face of the display, with a surface of the first bottom part and surfaces of the first peripheral parts forming an obtuse angle, the reflective sheet being integrally formed as a one-piece, unitary member, the reflective sheet having a plurality of holes each defined by edges of the first peripheral parts of corresponding one of adjacent sets of the first reflectors in a development view of the reflective sheet;
   a light processing member disposed between the display and the first reflectors, the light processing member being spaced apart from the first reflectors by a specific distance; and
   a plurality of light sources disposed relative to the surfaces of the first bottom parts, respectively.

2. The display device according to claim 1, wherein the first reflectors are arranged with respect to each other at a substantially equal interval.

3. The display device according to claim 1, wherein the first bottom parts have a polygonal shape.

4. The display device according to claim 1, wherein the first bottom parts have a regular hexagonal shape, and contact with sides of adjacent first peripheral parts.

5. The display device according to claim 4, wherein the display has a rectangular shape, and the outer edge extends parallel to a long side or a short side of the display.

6. The display device according to claim 4, wherein the reflective sheet has a plurality of second reflectors disposed along a peripheral side of the display and each having a second bottom part that has a pentagonal or tetragonal shape and a second peripheral part that extends from an outer edge of the second bottom part toward the rear face,
   the second bottom parts having a surface area that is smaller than a surface area of the first bottom parts.

7. The display device according to claim 6, wherein the light sources include light sources disposed at the surfaces of the first bottom parts and light sources disposed at surfaces of the second bottom parts,
   the display device further comprising a light intensity adjuster that adjusts light intensity of the light sources, light intensity of the light sources disposed at the surfaces of the second bottom parts being less than light intensity of the light sources disposed at the surfaces of the first bottom parts.

8. The display device according to claim 7, wherein the light intensity adjuster adjusts the light intensity of the light sources based on an amount of power supplied to the light sources or a duty ratio.

9. The display device according to claim 6, wherein the first reflectors and the second reflectors are integrally formed with respect to each other.

10. The display device according to claim 1, wherein the first reflectors are integrally formed with respect to each other.

11. The display device according to claim 1, wherein distances between the light processing member and ends of the first peripheral parts on a light processing member side are substantially equal to each other.

12. The display device according to claim 1, wherein the first reflectors and the light processing member are arranged to satisfy the following condition:

$$0.2r \leq h \leq 0.5r$$

where r represents a distance between the first bottom parts and the light processing member, and h represents the specific distance.

13. The display device according to claim 1, wherein the first reflectors and the light processing member are arranged to satisfy the following condition:

$$0 < h \leq 0.04r$$

where r represents a distance between the first bottom parts and the light processing member, and h represents the specific distance.

14. The display device according to claim 1, wherein a distance between the first bottom parts and ends of the first peripheral parts on a light processing member side in a direction perpendicular to the surfaces of the first bottom parts is longer than a distance between the first bottom parts and ends of the light sources on the light processing member side.

15. The display device according to claim 1, wherein the first peripheral parts have a trapezoidal shape with an upper base that is located on the outer edge and a lower base that is longer than the upper base.

16. The display device according to claim 15, wherein the first peripheral parts are formed to satisfy the following condition:

$$60° < \theta 2 < 90°$$

where $\theta 2$ represents an angle formed between the lower base and an oblique side of the trapezoidal shape.

17. The display device according to claim 15, wherein oblique sides of adjacent first peripheral parts contact with each other.

18. A display device comprising:
   a display;
   a plurality of first reflectors each having a first bottom part that is disposed on a rear face side of the display and a first peripheral part that extends from an outer edge of the first bottom part toward a rear face of the display, with a surface of the first bottom part and a surface of the first peripheral part forming an obtuse angle;
   a light processing member disposed between the display and the first reflectors, the light processing member being spaced apart from the first reflectors by a specific distance; and
   a plurality of light sources disposed relative to the surfaces of the first bottom parts, respectively,
   the first bottom parts and the first peripheral parts being arranged to satisfy the following condition:

$$90° < \theta 1 \leq 135°$$

where $\theta 1$ represents the obtuse angle.

19. The display device according to claim 18, wherein the first bottom parts and the first peripheral parts are arranged to further satisfy the following condition:

$$125° \leq \theta 1 \leq 135°.$$

20. A display device comprising:
   a display;
   a plurality of first reflectors each having a first bottom part that is disposed on a rear face side of the display and a first peripheral part that extends from an outer edge of the first bottom part toward a rear face of the display, with a surface of the first bottom part and a surface of the first peripheral part forming an obtuse angle;

a light processing member disposed between the display and the first reflectors, the light processing member being spaced apart from the first reflectors by a specific distance; and a plurality of light sources disposed relative to the surfaces of the first bottom parts, respectively, the first reflectors and the light processing member being arranged to satisfy the following condition:

$0.2r \leq h \leq 0.8r$ where r represents a distance between the first bottom parts and the light processing member, and h represents the specific distance.

* * * * *